(12) United States Patent
Kondoh et al.

(10) Patent No.: US 8,325,483 B2
(45) Date of Patent: Dec. 4, 2012

(54) ELECTRONIC DEVICE INCLUDING A HEAT CONDUCTION MEMBER

(75) Inventors: Yoshiaki Kondoh, Kanagawa (JP); Hiroto Yahagi, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 70 days.

(21) Appl. No.: 12/298,734

(22) PCT Filed: Mar. 29, 2007

(86) PCT No.: PCT/JP2007/056836
§ 371 (c)(1), (2), (4) Date: Feb. 4, 2009

(87) PCT Pub. No.: WO2007/125718
PCT Pub. Date: Nov. 8, 2007

(65) Prior Publication Data
US 2009/0310311 A1    Dec. 17, 2009

(30) Foreign Application Priority Data

Apr. 27, 2006 (JP) ................................ 2006-124480
Apr. 27, 2006 (JP) ................................ 2006-124495

(51) Int. Cl.
*H05K 7/20* (2006.01)
*H04M 1/00* (2006.01)
*H01M 2/10* (2006.01)

(52) U.S. Cl. ................... 361/704; 361/714; 361/679.54; 455/575.1; 455/347; 429/100

(58) Field of Classification Search ................. 361/704, 361/707, 711, 714, 679.54; 455/575.1, 550.1, 455/347; 174/548, 252; 429/96, 100
See application file for complete search history.

(56) References Cited

U.S. PATENT DOCUMENTS

| 5,043,845 | A  | * | 8/1991 | McDermott et al. | ............ 361/705 |
| 7,242,585 | B2 |   | 7/2007 | Fukuma et al. | |
| 2004/0132503 | A1 | * | 7/2004 | Chiu | ............ 455/575.1 |
| 2005/0117291 | A1 |   | 6/2005 | Fukuma et al. | |
| 2005/0136969 | A1 | * | 6/2005 | Park | ............ 455/550.1 |
| 2005/0195573 | A1 | * | 9/2005 | Huang | ............ 361/709 |

FOREIGN PATENT DOCUMENTS
JP   07-086786   3/1995
(Continued)

OTHER PUBLICATIONS

Chinese language office action and its English language translation for corresponding Chinese application 200780023360.1.
Chinese language office action dated Nov. 26, 2010 and its English language translation for corresponding Chinese application 200780023360.1.

(Continued)

*Primary Examiner* — Zachary M Pape
(74) *Attorney, Agent, or Firm* — DLA Piper LLP (US)

(57) ABSTRACT

An electronic device able to stably disperse heat generated by an electronic component is provided. By providing a heat dissipating metal plate having a high heat conductivity between a TV tuner and a battery, heat generated by the TV tuner is dispersed to the battery having a large heat capacity and further dissipated to the outside of a case through a battery lid.

7 Claims, 7 Drawing Sheets

FOREIGN PATENT DOCUMENTS

| | | |
|---|---|---|
| JP | 07-221823 | 8/1995 |
| JP | 2003-060369 | 2/2003 |
| JP | 2005-109131 | 4/2005 |
| JP | 2005-129734 | 5/2005 |
| JP | 2005-244493 | 9/2005 |
| JP | 2005 534197 | 11/2005 |
| WO | WO 2004/017697 A1 | 2/2004 |

OTHER PUBLICATIONS

English translation of Korean office action dated Aug. 18, 2010 for corresponding Korean application 20087028934.

Japanese language office action dated Aug. 24, 2010 and its English language translation for corresponding Japanese application 2006124495.

* cited by examiner

BATTERY 4 AND TV TUNER 21
ARE SUPERIMPOSED
IN THICKNESS DIRECTION

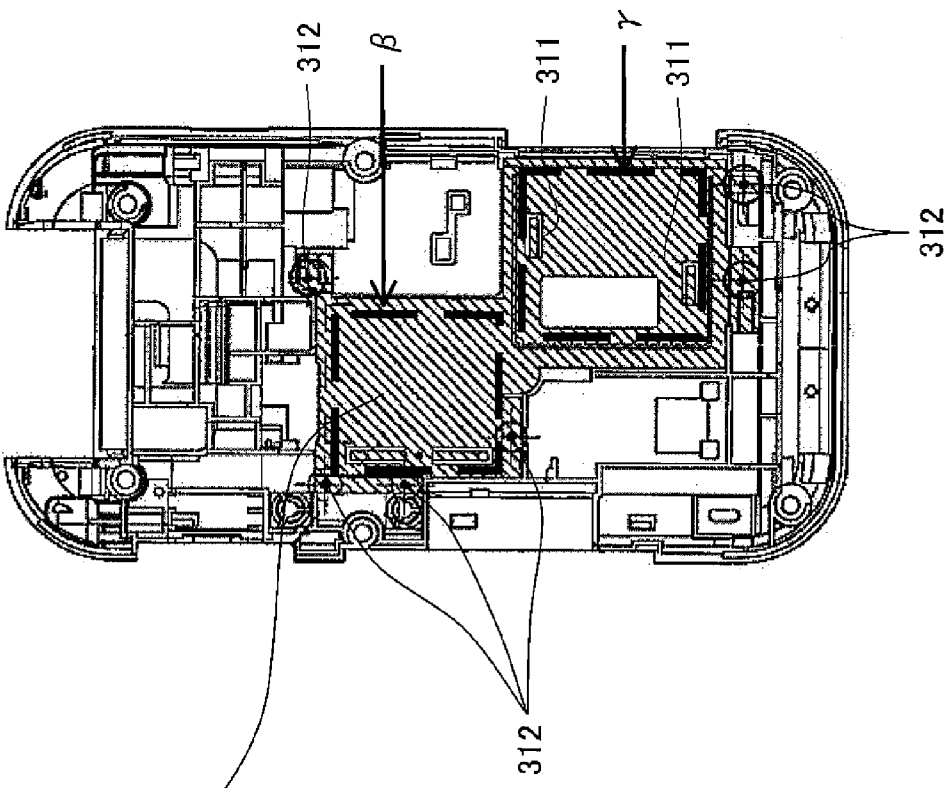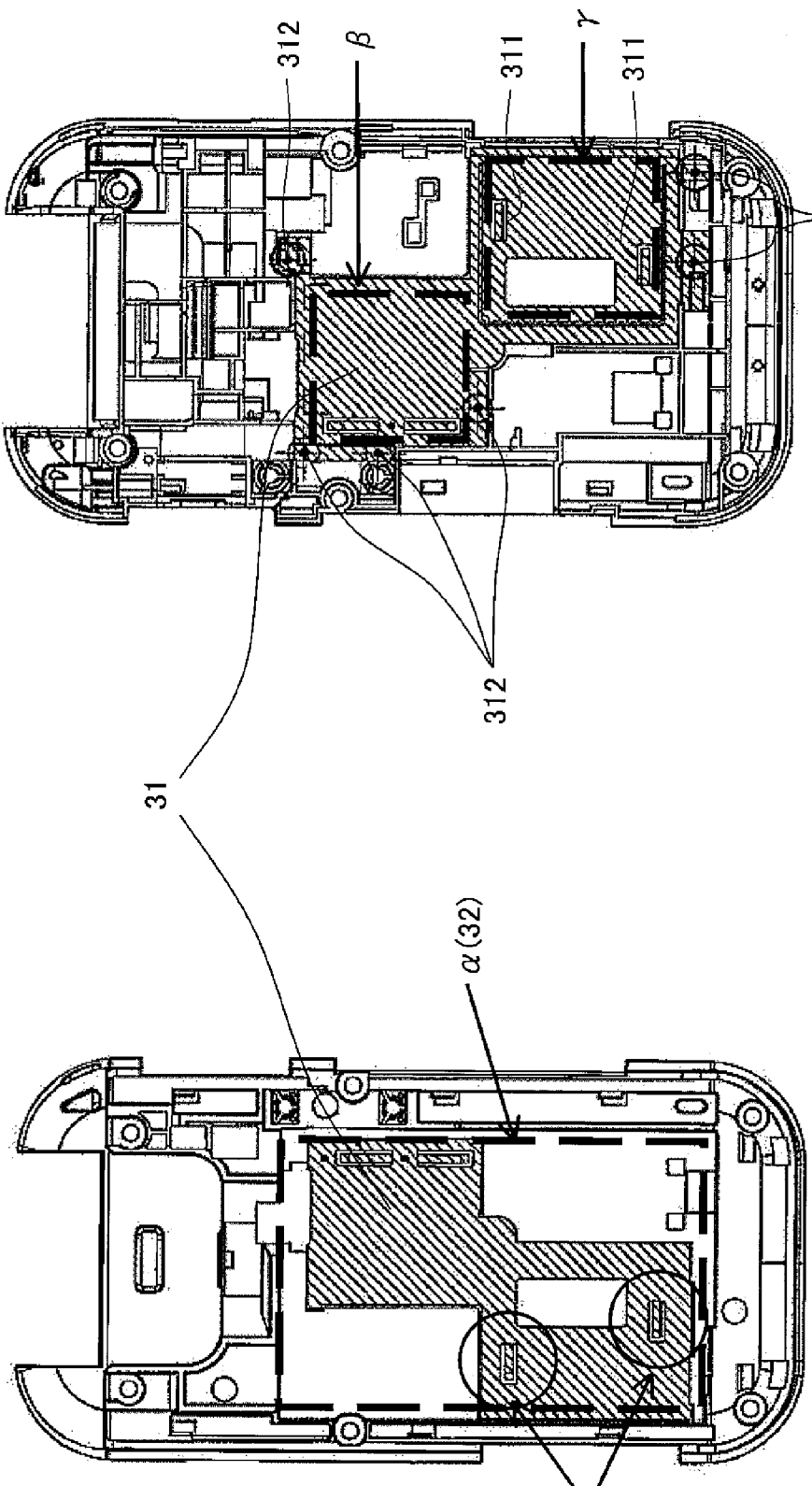

ELECTRONIC DEVICE INCLUDING A HEAT CONDUCTION MEMBER

TECHNICAL FIELD

The present invention relates to an electronic device including an electronic component generating heat.

BACKGROUND ART

Recently, electronic devices arranges electronic components by high density and increased in amount of heat generated along with their reduction in size and improvement in performance. In particular, in mobile phones, since Apr. 1, 2006, broadcasting services for portable electronic devices have formally started in Japan by the IDSB-T (Integrated service Digital Broadcasting-Terrestrial). It is anticipated that electronic devices mounting TV tuners will increase from now on.

However, TV tuner modules generate a considerable amount of heat during operation. In order to mount electronic components generating heat in this way in small cases such as mobile phones and other portable electronic devices, sufficient countermeasures against heat are necessary.

Conventionally, the following measures have been used to dissipate the heat of electronic components in electronic devices.

There were structures providing a fan structure in a case to cool electronic components generating a large amount of heat or attaching a radiator made of metal. However, in portable devices, use of these structures was difficult due to the problem of space.

Further, there was a structure forming a case of an electronic device by aluminum etc. having a high heat conductivity to improve the heat dissipation. This structure was possible, but had the disadvantage that the effect was low compared with the cost involved.

Other than these, as techniques for dissipating heat from electronic components generating high heat in electronic devices, there are, for example, the techniques disclosed in Patent Documents 1 to 3.

Patent Document 1: Japanese Patent Publication (A) No. 7-221823
Patent Document 2: Japanese Patent Publication (A) No. 2005-244493
Patent Document 3: Japanese Patent Publication (A) No. 2005-534197

Patent Document 1 discloses the technique of mounting an electronic component generating heat in the half of the case of a flip-open type mobile phone not having a receiver so as to suppress transfer of heat to the ear of the user.

Patent Document 2 discloses the technique of making a heat dissipation plate directly abut against an electronic component generating heat to allow heat to escape to the outside.

Patent Document 3 discloses the technique of bonding a special metal foil to a back of a substrate in order to make heat disperse to the back side of a substrate mounting an electronic component generating heat.

DISCLOSURE OF PRESENT INVENTION

Technical Problem

The technique disclosed in Patent Document 1 has as its object to suppress the transfer of heat generated by an electronic component at the time of speech to the ear of the user by employing a constitution arranging a circuit board on which an electronic component generating a large amount of heat is mounted in a transmitter side case. However, the countermeasure for heat of the case holding the circuit board on which the electronic component generating a large amount of heat is mounted was not sufficient, so there was the disadvantage that a local temperature rise occurred in the case.

Further, the technique disclosed in Patent Document 2 had the disadvantage that even when a heat dissipation plate was made to directly abut against an electronic component generating heat, the heat generated by the electronic component was not transferred to the heat dissipation plate well when the heat dissipation plate is not arranged with stability.

Further, the technique disclosed in Patent Document 3 had the disadvantage that it was costly to attach a metal foil to the back of the substrate.

In order to solve the disadvantages explained above, an object of the present invention is to provide an electronic device able to stably disperse and dissipate the heat generated by the electronic component.

Technical Solution

An electronic device of the present invention is provided with a case constituted so as to hold a circuit board and form a battery holding portion at a position facing a mount surface of the circuit board, and a battery constituted so as to be held in the battery holding portion, wherein the case has a portion forming the battery holding portion and facing the circuit board, the portion is formed with a heat conduction member having a higher heat conductivity in comparison with the other portions.

Effect of the Invention

According to the present invention, the portion of the battery holding portion formed facing the mount surface of the circuit board which faces the circuit board is constituted by a heat conduction member having a higher heat conductivity in comparison with the other portions, therefore an electronic device wherein heat generated at the mount surface of the circuit board is transferred to the battery held in the battery holding portion by the heat conduction member having a high heat conductivity and thereby the heat dissipation effect can be raised can be provided.

BRIEF DESCRIPTION OF THE DRAWINGS

FIG. 5 is a diagram for explaining the constitution of a key rear case 3 and a heat dissipating metal plate 31.

EXPLANATION OF NOTATIONS

100 . . . mobile phone, 101 . . . upper case, 102 . . . lower case, 103 . . . hinge portion, 1 . . . key front case, 2 . . . circuit board, 21 ... TV tuner, 22 ... heat conduction sheet, 23 ... card connector, 24 ... baseband processor, 31 ... heat dissipating metal plate, 311 ... contact spring, 312 ... melt-fusing portion, 3 ... key rear case, 32 ... battery holding portion, 4 ... battery, and 5 ... battery lid.

BEST MODE FOR CARRYING OUT THE INVENTION

Below, an embodiment of the present invention will be explained.

Figure 1:
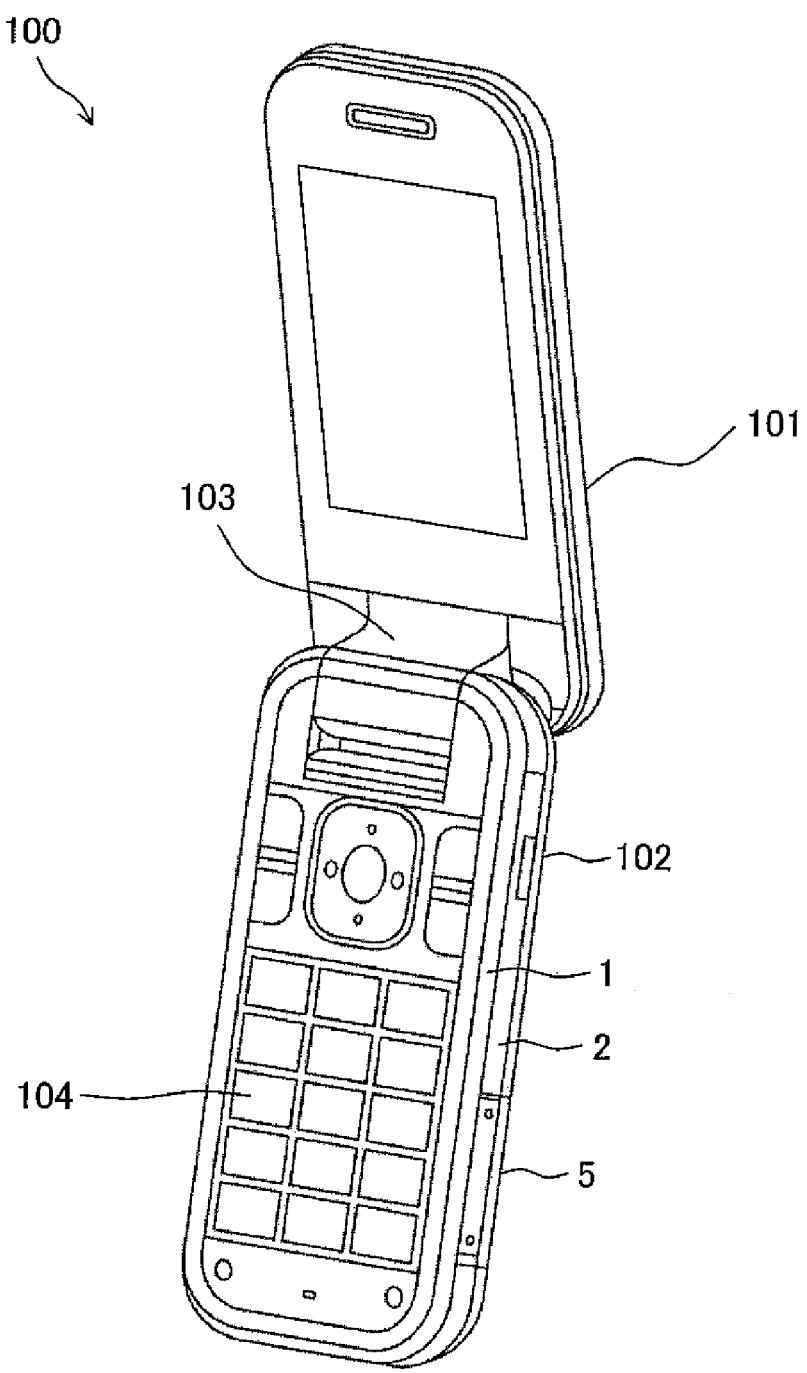
FIG. 1 is a diagram showing an outer appearance of a mobile phone 100 of the present embodiment.

FIG. 1 is a diagram showing an outer appearance of a mobile phone 100 of the present embodiment.

As shown in FIG. 1, the mobile phone 100 is constituted by an upper case 101 and a lower case 102.

The upper case 101 and the lower case 102 are constituted so that these can be opened/closed by a hinge portion 103.

The upper case 101 has a liquid crystal screen or other display portion.

The lower case 102 holds a circuit board on which electronic components generating heat at the time of operation are mounted.

Below, the lower case 102 will be explained in detail.

Figure 2:
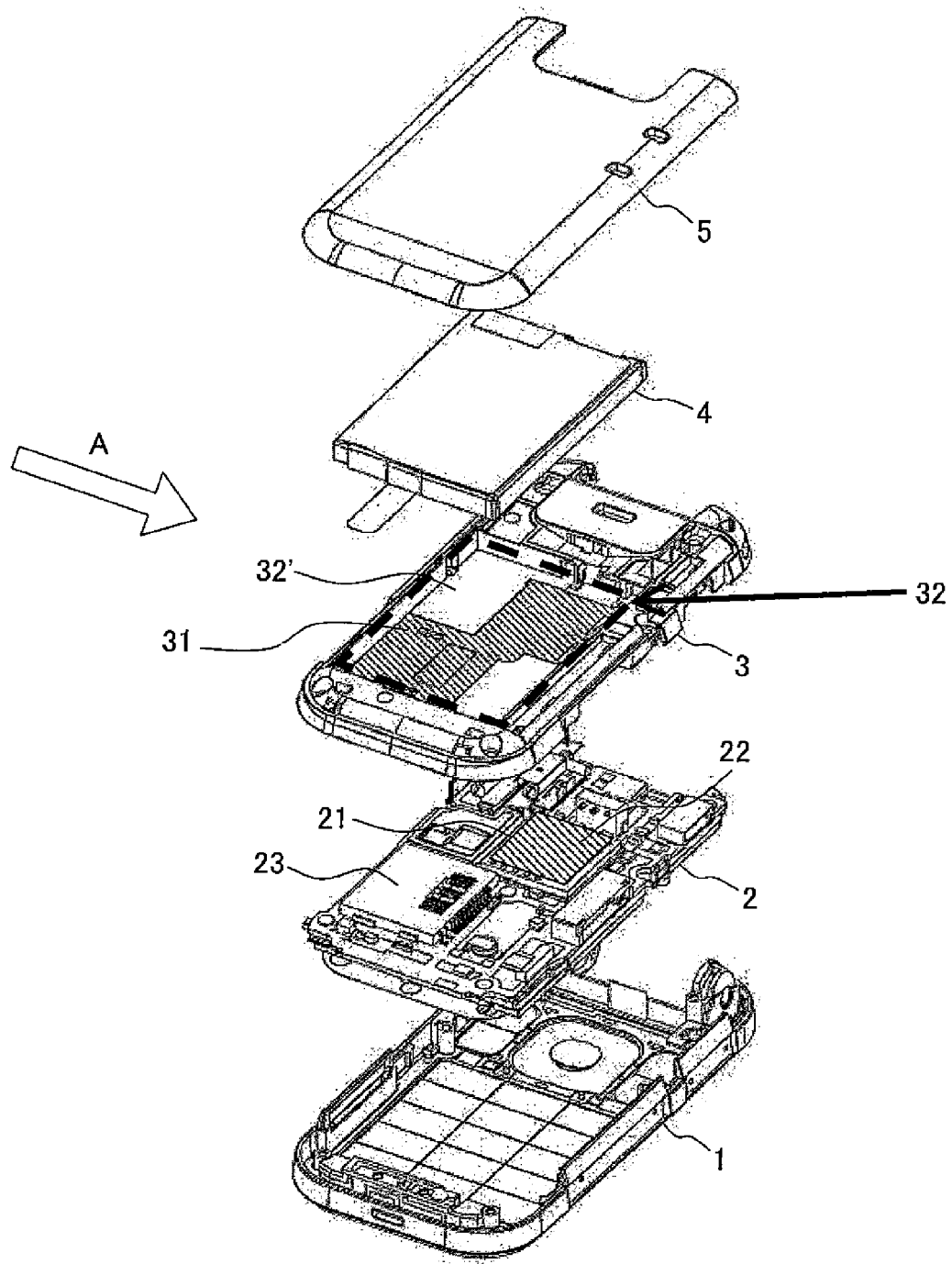
FIG. 2 is a diagram showing an example of the constitution of a lower case 102.

The lower case 102, as shown in FIG. 1 and FIG. 2, has a key front case 1 in which ten-keys and other key buttons 104 are provided, a circuit board 2, a key rear case 3 connected to the key front case 1, a battery 4 as a power supply of the mobile phone 100, and a battery lid 5. These are disposed in a thickness direction of the lower case 102 so as to be superimposed on each other.

The circuit board 2 is held in the lower case 102 while being sandwiched by the key front case 1 and the key rear case 3. On both of the mount surface on the front surface side thereof and the mount surface of the back surface side, LSIs and other electronic components for realizing the operation as a mobile phone are mounted. These electronic components generate heat at the time of operation, therefore it is necessary to dissipate the heat.

Hereinafter, as an example of electronic components generating heat, a TV tuner 21 and a baseband processor 24 will be mentioned.

Figures 3A, 3B:
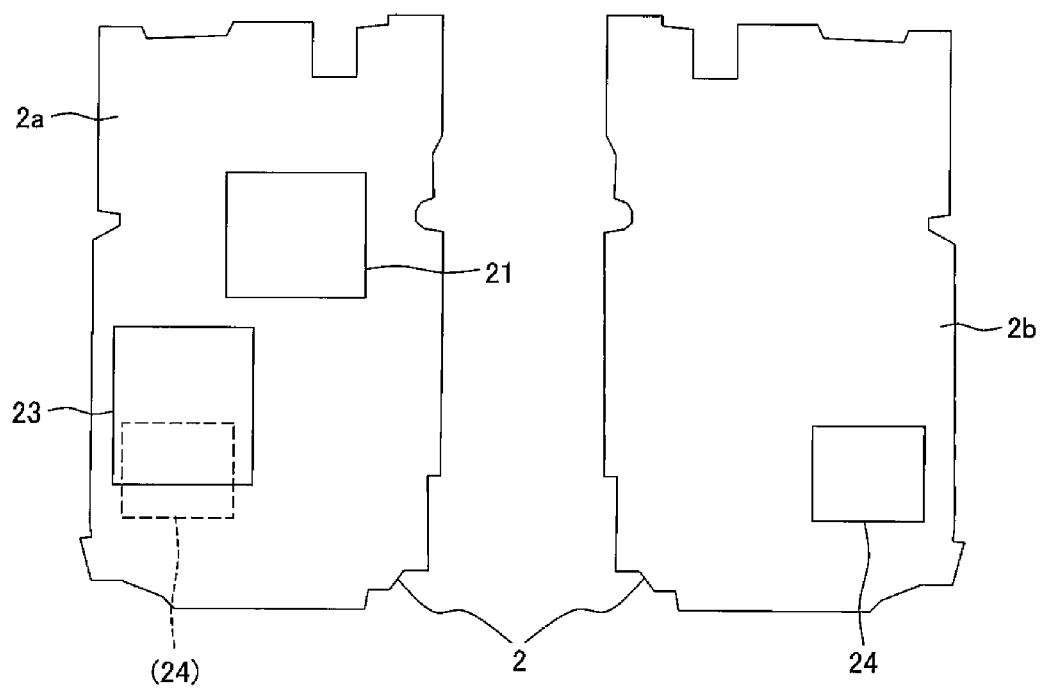
FIG. 3 is a diagram showing an arrangement of a TV tuner 21, a card connector 23, and a baseband processor 24 on a circuit board 2.

FIG. 3 is a schematic diagram for showing the relationship of arrangement of the TV tuner 21, card connector 23, and baseband processor 24 on the circuit board 2. FIG. 3A is a plan view when viewing the circuit board 2 from the battery 4 side and shows a mount surface (first mount surface) 2a on the back surface side of the circuit board 2, and FIG. 3B is a plan view when viewing the circuit board 2 from the key front case 1 side and shows a mount surface (second mount surface) 2b on the front surface side of the circuit board 2.

In the present embodiment, as shown in FIG. 3A, on the mount surface (mount surface on key rear case 3 side) 2a on one side of the circuit board 2, the TV tuner 21 and the card connector 23 are mounted. As shown in FIG. 3B, on the other mount surface (mount surface on key front case 1 side) 2b, the baseband processor 24 is mounted.

The TV tuner 21 (first heat generation module) is a tuner receiving TV broadcasting waves and generates heat at the time of operation (at the time of reception of a TV broadcast).

The TV tuner 21 mounted on the circuit board 2 has a heat conduction sheet (abutment member) 22 having a high heat conductivity adhered to its upper surface (surface on the key rear case 3 side) and abuts against the heat dissipating metal plate 31 explained later via the heat conduction sheet 22. The heat conduction sheet 22 may be formed by a material capable of transferring heat, for example, silicone rubber. The heat conduction sheet 22 has a function of efficiently transferring the heat generated by the TV tuner 21 to the heat dissipating metal plate 31 explained later.

In the key rear case 3, as shown by a dotted line in FIG. 2, has a battery holding portion 32 formed in a concave state arranged at a position facing the battery 4 at the surface opposite to the circuit board 2. The battery 4 is held in this battery holding portion 32. Then, in the key rear case 3, a battery lid 5 is attached so as to cover the battery holding portion 32. Due to this, the battery 4 held in the battery holding portion 32 is covered by the battery lid 5. That is, the battery holding portion 32 is formed at a position facing the mount surface 2a of one side of the circuit board 2.

The key front case 1, key rear case 3, and battery lid 5 are constituted by resin materials. Further, in the key rear case 3 in the present embodiment, on a bottom surface of the battery holding portion (position forming the battery holding portion 32 and facing the circuit board 2) 32', as shown in FIG. 2, the heat dissipating metal plate 31 serving as the heat conduction member is provided. Namely, at least a portion of this bottom surface 32' is constituted by a metal plate member constituting the heat dissipating metal plate 31 in place of a resin material. The heat dissipating metal plate 31 is formed, in order to secure a high heat dissipation property, by a metal having a higher heat conductivity than the resin forming the key rear case 3, for example, nickel silver, aluminum, or stainless steel. Note that the heat dissipating metal plate 31 is not limited to a metal plate member and may be constituted by another heat conduction member having a high heat conductivity as well.

Figure 4:
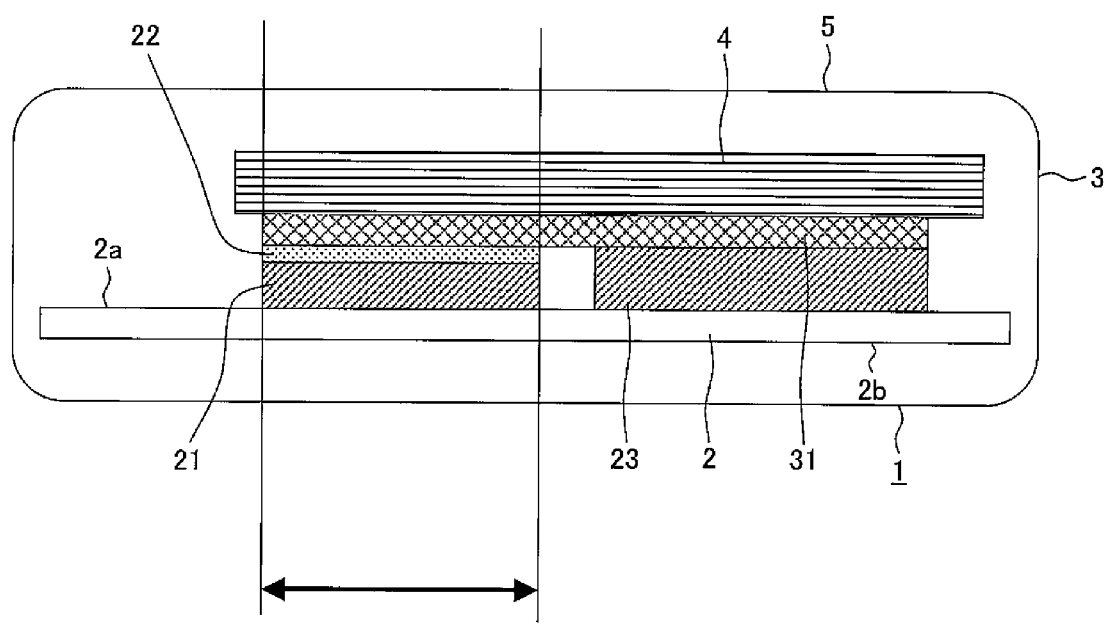
FIG. 4 is a schematic cross-sectional view when viewing the mobile phone 100 from the side in order to show a positional relationship between the TV tuner 21 and a battery 4.

Further, as shown in FIG. 2 and FIG. 4, the TV tuner 21, the heat dissipating metal plate 31, and the battery 4 are arranged in the thickness direction of the mobile phone 100 so as to be superimposed on each other.

FIG. 4 is a diagram when viewing the mobile phone 100 from the side (arrow A shown in FIG. 2) in order to show the positional relationship between the TV tuner 21 and the battery 4. As shown in FIG. 4, the TV tuner 21 is mounted on the mount surface 2a of one side of the circuit board 2 at a position where it is superimposed on the battery holding portion 32 in a case thickness direction, while the heat dissipating metal plate 31 is disposed on the bottom surface 32' of the battery holding portion 32 facing this TV tuner 21. Note that at the position of the circuit board 2 facing the battery holding portion 32, many electronic components are mounted other than the TV tuner 21. For example, the card connector 23 to which a memory card can be attached and having an outer surface formed by a metal plate member is mounted. Further, the heat dissipating metal plate 31 is integrally formed in a shape arranged at a position on the bottom surface 32' facing the card connector 23.

Further, when the battery 4 is held in this battery holding portion 32, as shown in FIG. 4, the TV tuner 21, the heat conduction sheet 22, the heat dissipating metal plate 31, and the battery 4 on the circuit board 2 are arranged so that these are sequentially superimposed on each other in the thickness direction of the case. Accordingly, the heat generated from the TV tuner 21 and other electronic components mounted on the mount surface 2a on one side of the circuit board 2 will be transferred to the heat dissipating metal plate 31, transferred to the battery 4 abutted against the heat dissipating metal plate 31, and dissipated to the outside through the battery 4 having a large heat capacity. Further, the battery 4 is, as shown in FIG. 2, located in the outermost surface portion of the mobile phone 100 except the battery lid 5, therefore the heat absorbed into the battery 4 is dissipated to the outside through the battery lid 5.

In particular, by disposing the heat dissipating metal plate 31 on the bottom surface 32' of the battery holding portion 32 and the abutment of this heat dissipating metal plate 31 and the battery 4 held in the battery holding portion 32 having the bottom surface 32' constituted by the heat dissipating metal plate 31, the heat transferred to the heat dissipating metal plate 31 is efficiently transferred to the battery 4, therefore the heat from the circuit board 2 side can be effectively dissipated. Further, in the present embodiment, the TV tuner 21 is made to abut against the heat dissipating metal plate 31 via the heat conduction sheet 22, therefore the heat generated by the TV tuner 21 will reliably transferred to the heat dissipating metal plate 31 via the heat conduction sheet 22, and the heat from the TV tuner 21 having a high heat generation property will be efficiently transferred to the heat conduction sheet 22, the heat dissipating metal plate 31, and the battery 4 and therefore will be more effectively dissipated.

By employing the constitution as described above, it becomes possible to disperse the heat generated by the TV tuner 21 to the battery 4 having a large heat capacity through the heat conduction sheet 22 and the heat dissipating metal plate 31 and thereby dissipate the heat.

Further, as the electronic component generating heat on the circuit board 2, other than the TV tuner 21, there is, for example, a baseband processor 24 (second heat generation module of the present invention). The TV tuner 21 and the baseband processor 24 are disposed as follows. The heat generated by the electronic components can be dispersed.

Namely, the baseband processor 24 is mounted on the mount surface 2b of the circuit board 2 on the opposite side to the mount surface 2a on which the TV tuner 21 is mounted. The baseband processor 24 is a processor conducting the basic function of speech/communication of the mobile phone 100 and generates heat at the time of the operation (time of speech/time of communication).

In the plan view of the circuit board 2 when seen from the battery 4 side shown in FIG. 3A, the position of the baseband processor 24 in a case where the circuit board 2 is viewed in cross-section is indicated by a dotted line. As shown in FIG. 3A, the TV tuner 21 and the baseband processor 24 are arranged so that these are not superimposed on each other in the thickness direction. Preferably, the TV tuner 21 and the baseband processor 24 are arranged so that these are separated as much as possible on the circuit board 2. By arranging the TV tuner 21 and the baseband processor 24 while separating these as much as possible, even when these two heat generation modules simultaneously generate heat, a local temperature rise of the circuit board 2 is suppressed and it becomes possible to disperse the temperature rise of the entire mobile phone 100.

Next, the key rear case 3 and the heat dissipating metal plate 31 will be explained in detail.

FIG. 5 is a diagram for explaining the key rear case 3 and the heat dissipating metal plate 31.

First, FIG. 5A is a diagram when viewing the key rear case 3 and the heat dissipating metal plate 31 from the battery 4 side. The heat dissipating metal plate 31 is melt bonded at a hatching portion shown in FIG. 5A of the key rear case 3. A portion α surrounded by the dotted line of FIG. 5A shows the position where the battery 4 contacts the key rear case 3 (bottom surface 32' of the battery holding portion 32) when it is held in the battery holding portion 32. As shown in FIG. 5A, this is designed so that the overall heat dissipating metal plate 31 contacts the battery 4 so that the heat can be efficiently dissipated through the heat dissipating metal plate 31.

FIG. 5B is a diagram when viewing the key rear case 3 and the heat dissipating metal plate 31 from the circuit board 2 side. As shown in FIG. 5B, the heat dissipating metal plate 31 is melt bonded to the key rear case 3 at several melt bonding portions 312. The number and positions of the melt-bonding portions 312 are not particularly limited in the present invention. However, preferably positions of the melt-bonding portions 312 are selected so that a thickness obtained by adding the thicknesses of the key rear case 3 and heat dissipating metal plate 31 becomes as thin as possible. In this way, the key rear case 3 formed by the resin material is integrally formed with the melt bonded heat dissipating metal plate 31.

Further, a portion β surrounded by the dotted line of FIG. 5B shows the position where the heat conduction sheet 22 adhered to the TV tuner 21 contacts the heat dissipating metal plate 31. Further, a portion γ surrounded by the dotted line of FIG. 5B shows a position where the card connector 23 and the heat dissipating metal plate 31 contact. As shown in FIG. 5B, the heat dissipating metal plate 31 is formed and arranged in the key rear case 3 so that an area of the portion β where the heat conduction sheet 22 adhered to the TV tuner 21 contacts the heat dissipating metal plate 31 becomes smaller in comparison with the surface area of the heat dissipating metal plate 31, that is, the surface area of the heat dissipating metal plate 31 becomes greater than the surface area of the heat conduction sheet. Accordingly, by interposition of the heat dissipating metal plate 31, the contact area of the TV tuner 21 and the battery 4 is increased.

Further, as shown in FIG. 5A and FIG. 5B, the heat dissipating metal plate 31 has a contact spring 311. The contact spring 311 is disposed at a position facing the card connector 23 mounted on the mount surface 2a of one side of the circuit board 2. Then, by the abutment of the contact spring 311 of the heat dissipating metal plate 31 against the outer surface (metal plate portion) of the card connector 23 electrically connected with a ground portion of the circuit board 2, the heat dissipating metal plate 31 is electrically connected with the ground portion of the circuit board 2 through the card connector 23 and the contact spring 311. The position and form of this contact spring 311 are not limited in the present invention. The position and form may be determined so that the heat dissipating metal plate 31 is electrically connected with the ground portion of the circuit board 2.

By the constitution explained above, at the time of the operation of the mobile phone 100, the heat generated by the TV tuner 21 and other electronic components is transferred through the heat dissipating metal plate 31 to the battery 4 and dissipated.

In particular, the heat generated by the TV tuner 21 is transferred to the battery 4 superimposed on the TV tuner 21 in the thickness direction through the heat conduction sheet 22 and the heat dissipating metal plate 31. The battery 4 is a large-sized member and has a large heat conductivity, therefore can disperse the heat of the TV tuner 21 with a high efficiency.

That is, by interposing the heat dissipating metal plate 31, the area for transferring the heat from the TV tuner 21 to the battery 4 becomes greater, therefore the heat generated by the TV tuner 21 can be efficiently transferred to the battery 4 in contrast to a constitution in which the heat dissipating metal plate 31 is not disposed, and the heat conduction sheet 22 or the TV tuner 21 directly contacts the battery 4.

FIG. 6 is a diagram for explaining the heat conduction efficiencies from the TV tuner 21 to the battery 4 in a constitution in which the heat dissipating metal plate 31 is not disposed and a constitution in which it is disposed. The explanation is made by focusing on the presence/absence of the heat dissipating metal plate 31. Therefore, in FIG. 6, the heat conduction sheet 22 is omitted.

Figure 6A:
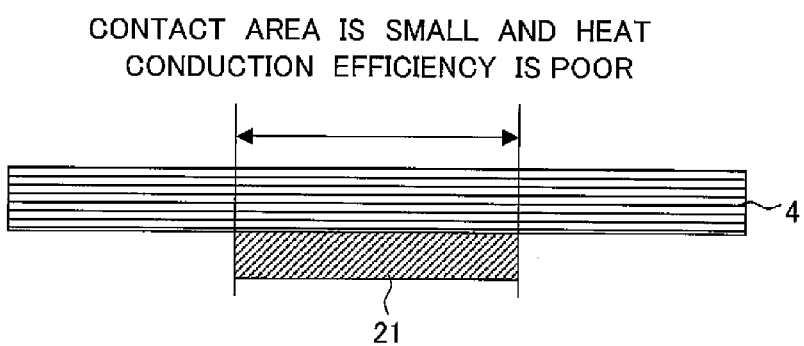
FIG. 6 is a diagram for explaining heat conduction from the TV tuner 21 to the battery 4.
Figure 6B:
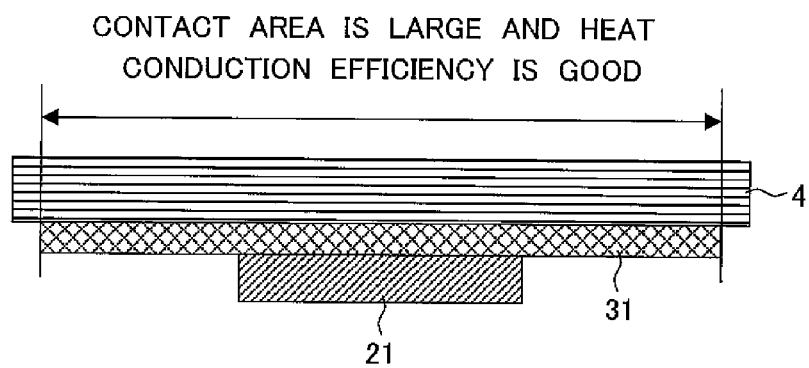

FIG. 6A shows a constitution in which the heat dissipating metal plate 31 is not disposed, while FIG. 6B shows a constitution in which the heat dissipating metal plate 31 is disposed. These figures show diagrams when viewing the contact portion of the TV tuner 21 and the battery 4 from the lateral side of the mobile phone 100.

As shown in FIG. 6A, in a constitution in which the heat dissipating metal plate 31 is not disposed, the contact area of the battery 4 and the TV tuner 21 is small, therefore the heat conduction efficiency is poor. In a constitution in which the heat dissipating metal plate 31 is disposed as shown in FIG. 6B, as explained with reference to FIG. 5B, the contact area of the heat dissipating metal plate 31 and the battery 4 is broader than the contact area of the TV tuner 21 and the battery 4 shown in FIG. 6A, therefore the heat conduction efficiency from the TV tuner 21 to the battery 4 becomes good.

Further, the card connector 23 connected to the TV tuner 21 via the heat dissipating metal plate 31 has a relatively large heat conductivity as well, therefore the heat generated by the TV tuner 21 is dispersed to the card connector 23 through the heat conduction sheet 22 and the heat dissipating metal plate 31 as well.

Further, in addition to the dispersion of the heat generated by the TV tuner 21 to the battery 4 and the card connector 23, a heat source other than the TV tuner 21 (the baseband processor 24 in the present embodiment) is mounted on the mount surface 2b on the other side of the circuit board 2 at the position where it is not superimposed on the TV tuner 21 in the thickness direction. Namely, the TV tuner 21 and the baseband processor 24 are disposed while being separated, therefore it becomes possible to disperse the temperature rise when seen from the entire lower case 102.

As explained above, according to the mobile phone 100 of the present embodiment, the heat dissipating metal plate 31 having a good heat conductivity and having a broader contact area with the battery 4 than the TV tuner 21 is disposed by melt-bonding at a portion between the TV tuner 21 and the battery 4 in the key rear case 3, therefore the heat generated by the TV tuner 21 can be efficiently transferred to the battery 4.

Further, the heat conduction sheet 22 having a good heat conductivity is disposed by adhesion between the TV tuner 21 and the heat dissipating metal plate 31, therefore it is possible to transfer the heat generated by the TV tuner 21 to the heat dissipating metal plate 31 with a good efficiency.

Further, as a secondary effect of the heat dissipating metal plate 31, the heat dissipating metal plate 31 formed by a metal plate, aluminum, or other metal is disposed in the key rear case 3 formed by a resin by melt-bonding, therefore the strength of the entire case of the lower case 102 of the mobile phone 100 can be raised.

Further, the key rear case 3 is integrally constituted by melt-bonding the heat dissipating metal plate 31 to the portion holding the battery 4, therefore it is possible to make the key rear case 3 thinner than a key rear case 3 formed by only a resin, accordingly it is possible to make the entire mobile phone 100 thinner.

Further, the metal heat dissipating metal plate 31 is melt-bonded and disposed in the key rear case 3, therefore a not shown electronic component mounted on the mount surface 2a on the key rear case 3 side (battery 4 side) of the circuit board 2 can be electrically shielded.

Further, according to the mobile phone 100 of the present embodiment, the heat dissipating metal plate 31 contacts not only the TV tuner 21 and battery 4, but also the card connector 23, therefore the heat generated by the TV tuner 21 can be dispersed to not only the battery 4, but also the card connector 23 having a large heat conductivity. Due to this, the heat generated by the TV tuner 21 can be dispersed more.

Further, according to the mobile phone 100 of the present embodiment, two large heat generation modules, that is, the TV tuner 21 and the baseband processor 24, are mounted on the circuit board 2. However, the TV tuner 21 and the baseband processor 24 are mounted on different surfaces of the circuit board 2 and further arranged so that they are not superimposed on each other in the thickness direction of the mobile phone 100, therefore the TV tuner 21 and the baseband processor 24 are arranged separated in a plane direction of the circuit board 2, and the local temperature rise due to the heat generated by these two heat generation modules can be dispersed.

The present invention is not limited to the embodiment explained above.

Namely, when working the present invention, various modifications, combinations, sub-combinations, and alterations may occur concerning the components of the embodiment explained above insofar as they are within the technical range of the present invention or the equivalents thereof.

The mobile phone 100 of the present embodiment was configured dispersing the heat generated by the TV tuner 21 to not only the battery 4, but also the card connector 23, but the present invention is not limited to this. The electronic component for transferring and dispersing the heat generated by the TV tuner 21 other than the battery 4 may be any electronic component which is resistant to heat and has a large heat conductivity among the electronic components mounted on the mount surface 2a on the same side as the TV tuner 21 of the circuit board 2. For example, it may be a headphone jack etc.

Further, in the present invention, a constitution without an electronic component dispersing heat generated by the TV tuner other than the battery 4, for example, the card connector 23, may be employed. It may configured with the battery 4 and the TV tuner 21 arranged superimposed on each other in the thickness direction, whereby the heat of the TV tuner 21 is dispersed to the battery 4.

Further, in the mobile phone 100 of the present embodiment, the heat conduction sheet 22 was adhered to the TV tuner 21, but the present invention is not limited to this. Namely, the heat conduction sheet 22 may be adhered to the heat dissipating metal plate 31 as well. Further, in the present invention, a constitution where the heat conduction sheet 22 is not disposed can also be considered. Namely, it may be configured so that the TV tuner 21 and the heat dissipating metal plate 31 are directly abutted, and no heat conduction sheet 22 is disposed either.

Further, in the mobile phone 100 of the present embodiment, by disposing the heat dissipating metal plate 31 as the heat conduction member having a higher heat conductivity in comparison with the other portions at the position (bottom surface 32' of the battery holding portion 32) facing the circuit board in the battery holding portion 32 in which the battery 4 is held, the heat generated from the electronic component mounted on the circuit board 2 is efficiently transferred through the heat dissipating metal plate 31 to the battery, and the heat dissipation property can be improved. This heat dissipating metal plate 31 is not limited to a metal plate member and may be constituted by a heat conduction member having a higher heat conductivity in comparison with the other portions.

Further, in the mobile phone 100 of the present embodiment, the TV tuner 21 was arranged on the circuit board 2 so as to be superimposed on the battery 4 in the thickness direction. However, the present invention is not limited to this.

Namely, the TV tuner 21 may be mounted on the circuit board 2 at a position where it is not superimposed on the battery 4 in the thickness direction. In this case, the heat dissipating metal plate 31 is constituted so as to be extended up to the upper portion of the TV tuner 21 and abutted against the TV tuner 21. In the same way as the embodiment explained above, the heat generated by the TV tuner 21 and other electronic components on the circuit board 2 will be transferred to the battery 4 through the heat dissipating metal plate 31 and dissipated.

Further, in the embodiment explained above, an explanation was given mentioning as an example the TV tuner 21 as the heat generation module mounted on the circuit board 2. However, it is also possible to apply the present invention to another heat generation module, that is, another electronic component having a large heat generation amount, and needing a countermeasure for heat. Further, in the embodiment explained above, the battery 4 is preferably configured so that the heat transferred from the heat dissipating metal plate is absorbed and easily dissipated. Namely, it is preferably configured so that, for example, a battery cell having an outer surface constituted by a metal material is exposed.

Figure 7A:
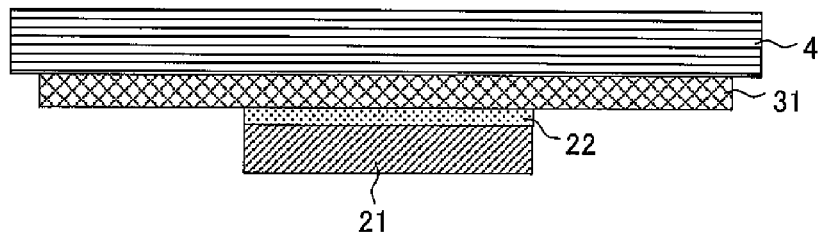
FIG. 7 is a diagram for explaining an example of the constitution of the present invention.
Figure 7B:
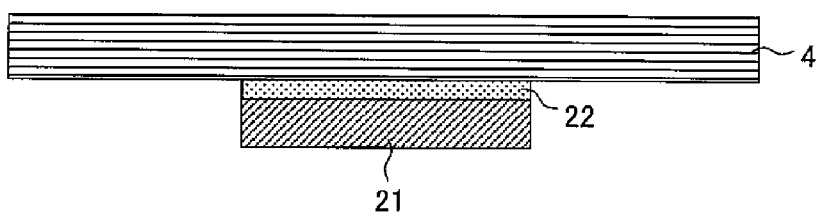
Figure 7C:
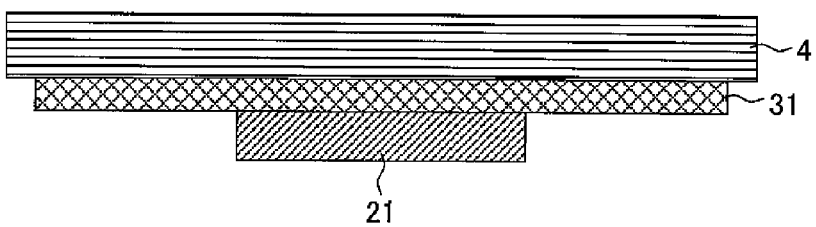
Figure 7D:
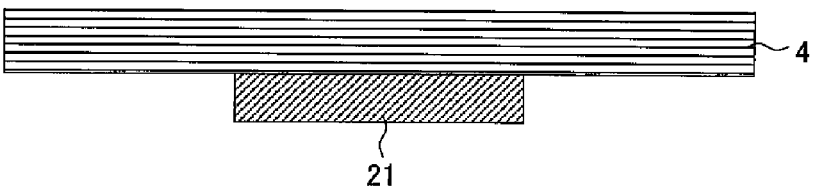

Note that, in the present invention, a constitution where the heat dissipating metal plate 31 is not disposed can also be employed. In a constitution in which the heat dissipating metal plate 31 is not disposed, the contact area of the TV tuner 21 and the battery 4 is small, so the effect that the heat dissipation efficiency becomes good as explained above no longer can be obtained. However, the TV tuner 21 is mounted on the circuit board 2 so as to be superimposed on the battery 4 in the thickness direction of the mobile phone 100, therefore the TV tuner 21 and the battery 4 can be directly abutted, so the heat generated by the TV tuner 21 is directly transferred to the battery 4, and it is possible to obtain the effect of the present invention of avoiding the disadvantage that the heat is confined in the circuit board portion on which the TV tuner is mounted From the above, as the present invention, four aspects as shown in FIG. 7A to FIG. 7D can be considered, namely, as explained in the embodiment explained above, a constitution in which both of the heat conduction sheet 22 and the heat dissipating metal plate 31 are disposed (FIG. 7A), a constitution in which only the heat conduction sheet 22 is disposed (FIG. 7B), a constitution in which only the heat dissipating metal plate 31 is disposed (FIG. 7C), and a constitution in which neither is disposed (FIG. 7D). Namely, in the present invention, the TV tuner 21 and the battery 4 may be disposed so that these are connected directly or indirectly via a substance having a high heat conductivity.

The invention claimed is:

1. An electronic device comprising:
   a circuit board;
   a metal member mounted on the circuit board;
   a heat generation module mounted on the circuit board;
   a case accommodating the circuit board and the heat generation module and comprising a metal plate that forms a part of a battery holding portion and has a heat conductivity higher than that of other portions; and
   a battery accommodated in the battery holding portion,
   wherein the metal plate contacts the battery on one side and contacts the heat generation module and the metal member on an other side, and
   wherein a contacting area, on one side of the metal plate, contacting the battery is larger than an area, on the opposite side of the metal plate, contacting the heat generation module.

2. An electronic device as set forth in claim 1, wherein the heat generation module is arranged at a position where the heat generation module is superimposed on the battery holding portion in a thickness direction of the case.

3. An electronic device as set forth in claim 1, wherein:
   the circuit board has the heat generation module mounted on a first mount surface facing the battery holding portion, and a second heat generation module mounted on a second mount surface on an opposite side to the first mount surface, and
   the second heat generation module is arranged at a position where the second heat generation module is not superimposed on the first heat generation module in the thickness direction of the case.

4. An electronic device as set forth in claim 1, wherein the case is formed by a resin material and is integrally formed with the metal plate.

5. An electronic device as set forth in claim 4, wherein the case is bonded with the metal plate.

6. An electronic device as set forth in claim 1, wherein the metal plate is electrically connected to the circuit board.

7. An electronic device comprising:
   a case;
   a circuit board disposed on one side of the case;
   a battery disposed in a battery holding portion formed on an other side of the case;
   a heat generation module that is mounted on the circuit board and faces the battery holding portion;
   a metal member that is mounted on the circuit board and faces the battery holding position; and
   a metal plate that forms a part of the battery holding portion and has a heat conductivity higher than that of other portions of the case,
   wherein the metal plate contacts the heat generation module and the metal member on one side and contacts the battery on an other side.

* * * * *